United States Patent [19]
Marlow

[11] Patent Number: 5,608,344
[45] Date of Patent: Mar. 4, 1997

[54] COMPARATOR CIRCUIT WITH HYSTERESIS

[75] Inventor: C. Allen Marlow, Ann Arbor, Mich.

[73] Assignee: SGS-Thomson Microelectronics, Inc., Carrollton, Tex.

[21] Appl. No.: 545,382

[22] Filed: Oct. 19, 1995

[51] Int. Cl.$^6$ ............... H03K 3/037; H03K 3/01
[52] U.S. Cl. ............... 327/206; 327/68; 327/534
[58] Field of Search ............... 327/68, 74, 142, 327/143, 198, 205, 206, 534–537, 560, 63–67, 69–73, 75–89

[56] References Cited

U.S. PATENT DOCUMENTS

| | | | |
|---|---|---|---|
| 4,324,990 | 4/1982 | Gay | 307/350 |
| 4,535,294 | 8/1985 | Ericksen et al. | 328/150 |
| 4,694,198 | 9/1987 | Umeki | 307/290 |
| 4,775,807 | 10/1988 | Bukowski, Jr. | 327/72 |
| 4,806,791 | 2/1989 | Mizuide | 307/355 |
| 4,972,517 | 11/1990 | Kondou et al. | 307/270 |
| 5,113,092 | 5/1992 | Herold | 327/65 |
| 5,140,187 | 8/1992 | Schwob | 307/355 |
| 5,177,376 | 1/1993 | Wellnitz et al. | 307/290 |
| 5,182,471 | 1/1993 | Yoshida | 307/355 |
| 5,223,743 | 6/1993 | Nakagawara | 307/296.1 |
| 5,264,740 | 11/1993 | Wright | 307/355 |
| 5,274,275 | 12/1993 | Colles | 307/362 |
| 5,289,054 | 2/1994 | Lucas | 307/355 |
| 5,334,883 | 8/1994 | Rosenthal | 307/290 |
| 5,369,319 | 11/1994 | Good et al. | 327/73 |
| 5,422,591 | 6/1995 | Rastegar et al. | 327/537 |

*Primary Examiner*—Toan Tran
*Attorney, Agent, or Firm*—Joseph C. Arrambide; Theodore E. Galanthay; Lisa K. Jorgenson

[57] ABSTRACT

A comparator with hysteresis which has a bias current circuit, a differential input stage, and an output stage is disclosed. The differential input stage uses an analog switch to connect the body of a field effect transistors to either a first voltage or a second voltage. The analog switch in the preferred embodiment is a double-throw switch.

17 Claims, 2 Drawing Sheets

5,608,344

COMPARATOR CIRCUIT WITH HYSTERESIS

BACKGROUND OF THE INVENTION

1. Field of the Invention

This invention relates to electronic circuits used as comparators, and more specifically to electronic circuits used as comparators with built-in hysteresis.

2. Description of the Relevant Art

The problem addressed by this invention is encountered in electronic circuits used to compare a first voltage to a second voltage. Commercially available comparators, such as an LM2904 are readily available and are often used to compare voltages. The LM2904 is designed for low hysteresis and low offset. However, it may be desirable in some applications to have hysteresis, such as in a reset circuit. FIG. 1 shows a prior art comparator, such as the LM2904, configured to have hysteresis as is known in the prior art. More specifically, FIG. 1 shows comparator 10 having a non-inverting input 4, an inverting input 12, and an output 8. Resistor 6 and resistor 3 add hysteresis to circuit, as is known in the art. Typical resistor values for this configuration are 10 kilo-ohm for resistor 3 and 1 mega-ohm for resistor 6. In fact, a problem with this circuit is that large resistor values are required and/or the circuit has an undesirable low gain.

FIG. 2 shows a prior art comparator circuit 16. This circuit includes a bias circuit 18, a differential input stage 20, and a hysteresis circuit 22. The bias circuit includes current source 24 connected in series with NPN bipolar transistor 26 and resistor 28. In operation, current is generated by current source 24 to forward bias transistor 26. This creates a bias voltage which is used by the transistors in the differential input stage 20 and by transistor 48 of the comparator 16.

The differential stage includes PNP transistors 30, 36, 40 and 44, NPN transistors 32 and 46, resistors 38 and 42, and current source 34. In operation, the base of transistor 36 is the non-inverting input of comparator 16 and the base of transistor 40 is the inverting input. When the base of transistor 36 is at a higher voltage than the base of transistor 40, transistor 40 turns on and conducts the current supplied by current source 34 while transistor 36 is off. Consequently, the transistor 46 is turned off which allows transistor 44 to drive the voltage on $V_{out}$ high. Conversely, if the base of transistor 36 is lower than the base of transistor 40, then transistor 36 is on and transistor 40 is off. This condition drives the emitter of transistor 46 low which turns transistor 46 on. Since transistor 46 is on, $V_{out}$ is driven to a low voltage.

The hysteresis circuit 22 includes PNP transistor 48 and resistor 50. In operation, transistor 48 turns on when the V⁻ input of the comparator is at a sufficiently low value to turn on transistors 40 and 48. With transistor 48 on, a voltage drop is developed across resistor 50. Therefore, the additional voltage drop is the hysteresis which must be overcome to switch the comparator when the voltage on the V⁻ input rises.

The problem with the prior art circuit in FIG. 2 is that the circuit requires resistors 38 and 42 to be relatively low resistance so that the circuit can have sufficient dynamic range without the transistors in the differential stage operating in saturation. Consequently, the circuit in FIG. 2 suffers from low gain.

FIG. 3 shows a circuit which is very similar to FIG. 2 and differs only in how the hysteresis in the circuit is achieved.

FIG. 3 shows a bias current circuit comprising transistor M18, Q29, and resistor R40. The differential input stage comprises transistors Q0, Q1, Q2, Q3, Q4, and Q5. The output stage comprises M15 and M19. M13, M14, M15, M16, and M51 are current sources for the circuit. The base of Q3 is the inverting input and the base of Q0 is the non-inverting input of the differential stage. Resistors R26, R29, and R36 form a voltage divider to set up the voltage reference for the inverting input and to form the hysteresis circuit.

In operation, the output of the circuit, opoff, switches when the input, drain, rises to the threshold voltage of the circuit. At that point, Q0 and Q1 turn off while transistors Q3 and Q2 turn on. With Q3 on, M36 and M19 are turned on thereby activating the hysteresis circuit and pulling the output to a low voltage, respectively. The hysteresis circuit is activated by transistor M36 effectively shorting resistor R30 which effectively changes the voltage reference on the inverting input. The problem with this circuit is that current is always flowing in through the voltage divider network. Additionally the resistor R36 reference voltage tends to vary.

FIG. 4 shows another prior art circuit for generating hysteresis in a comparator. In this example, resistor 50 and bipolar transistor 52 set up a bias voltage which is used by transistors 54 and 56 to generate bias currents for the differential pair. Transistors 64 and 70 form the differential pair of this comparator. The hysteresis for this circuit is generated by turning on or off transistor 56 with transistor 72 and by running the emitter current of transistor 70 through resistor 68. When the voltage at the base of transistor 64 is sufficiently higher than the voltage on the base of transistor 70, transistor 62, transistor 64 and transistor 66 are turned on and transistor 70 is turned off. Since transistor 70 is off and transistor 66 is on, the output voltage is high and transistor 72 is turned off. Therefore, transistor 56 is turned on and the current through the collector of transistor 64 is equal to the current flowing through transistors 54 and 56.

The comparator will switch states when the base voltage of transistor 70 is large enough to induce a current through transistor 70 which is equal to the current through transistor 64. Since the current requirement for the transition has now increased because transistor 56 is now on, whereas before it was turned off, the hysteresis is generated by the extra current through transistor 56 and the voltage drop across resistor 68. In other words, the hysteresis is generated by the tail currents of transistor 70.

SUMMARY OF THE INVENTION

Therefore, it is an object of the invention to provide a comparator which has high gain and easily designed hysteresis.

These and other objects, advantages, and features will be apparent to those skilled in the art from the following detailed description of the invention, when read in conjunction with the accompanying drawings and appended claims.

The invention can be summarized as a comparator with hysteresis which has a bias current circuit, a differential input stage, and an output stage. The differential input stage uses an analog switch to connect the body of a field effect transistors to either a first voltage or a second voltage. The analog switch in the preferred embodiment is a double-throw switch.

DETAILED DESCRIPTION OF AN EMBODIMENT OF THE INVENTION

Figure 1:
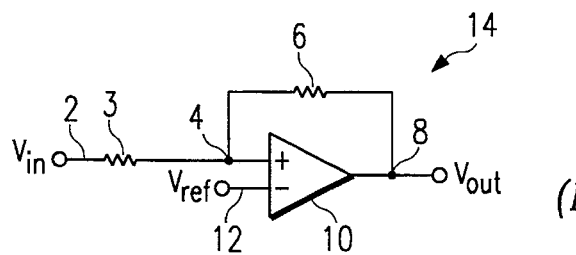
FIG. 1 is a block diagram of a comparator with hysteresis as known in the prior art.
Figure 2:
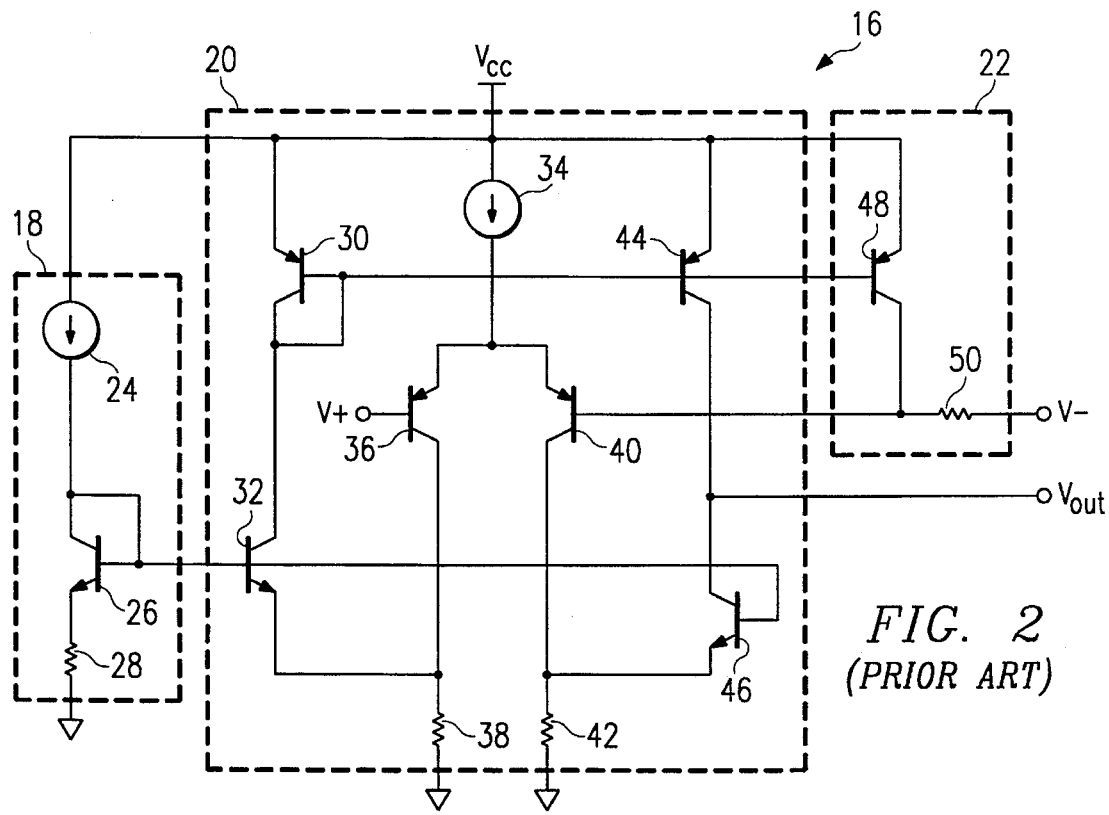
FIG. 2 is a schematic drawing of a comparator with internal hysteresis as known in the prior art.
Figure 4:
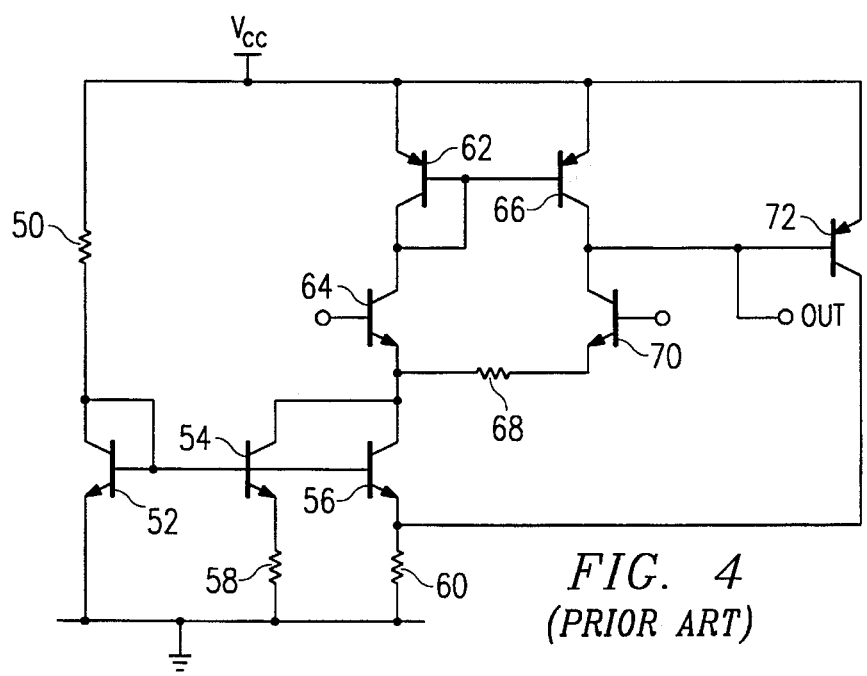
FIG. 4 is schematic drawing of a third comparator with internal hysteresis as known in the prior art.
Figure 3:
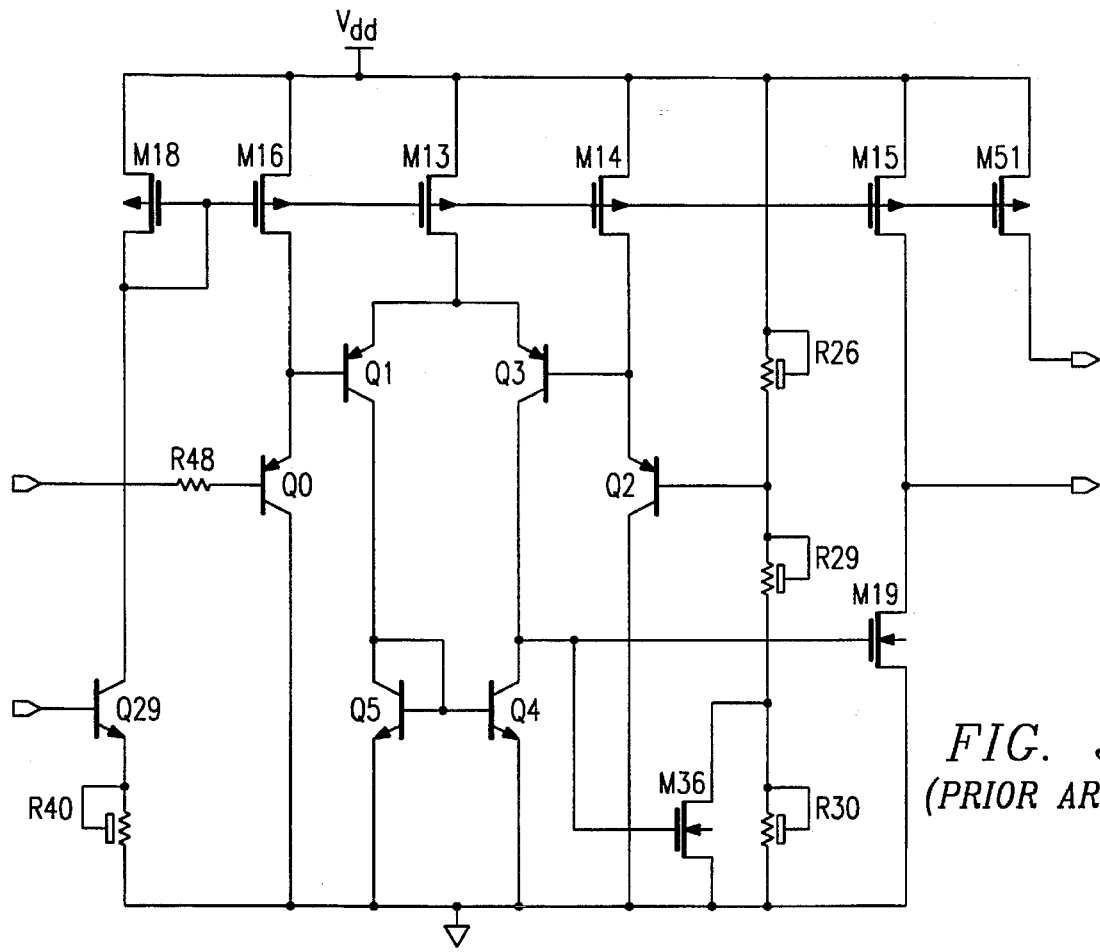
FIG. 3 is a schematic drawing of a second comparator with internal hysteresis as known in the prior art.

A comparator with hysteresis according to the embodiment in FIG. 5 will now be described. The comparator circuit is constructed from essentially three functional blocks: a bias current circuit, a differential input stage, and an output stage.

The bias current circuit is constructed by connecting the source of P-channel MOSFET transistor 100 to a voltage source, Vdd. The gate and drain of transistor 100 are connected to the source of P-channel MOSFET transistor 102 and to the gates of P-channel MOSFET transistors 104 and 106. The gate and drain of transistor 102 are connected to ground. The sources of transistors 104 and 106 are connected to Vdd. Therefore, bias currents are generated at the drains of transistors 104 and 106 for the use of the differential input stage and the output stage, respectively.

The differential input stage is constructed by connecting the sources of P-channel MOSFET transistors 108 and 116 to the drain of transistor 104. The gate of transistor 108 is the noninverting input of the comparator and the gate of transistor 116 is the inverting input of the comparator. The body of transistor 108 is connected to the pole of analog switch 112. Analog switch 112 is shown as a double-throw analog switch which can connect the body of transistor 108 to either a first reference voltage, $V_{B1}$ or a second reference voltage $V_{B2}$. Similarly, the body of transistor 116 is connected to analog switch 114. Analog switch 114 is shown as a double-throw analog switch which can couple the body of transistor 116 to either a first reference voltage, $V_{B1}$ or a second reference voltage, $V_{B2}$. Analog switch 112 is controlled by the output of the comparator. Analog switch 114 is controlled by the inverted output of the comparator. Therefore, the body of transistor 108 is connected to the first reference voltage when the body of transistor 116 is connected to the second reference voltage. Conversely, the body of transistor 108 is connected to the second reference voltage when the body of transistor 116 is connected to the first reference voltage.

The output stage is constructed by connecting the drain and gate of N-channel MOSFET transistor 110 to the drain of transistor 108 and to the gate of transistor 118. The source of transistor 110 is connected to ground. The source of transistor 118 is connected to ground while its drain is connected to the gate of N-channel MOSFET transistor 120 and the drain of transistor 116. The drain of transistor 120 is connected to the drain of transistor 106, the gates of transistors 122 and 124, and to the control element of analog switch 114. P-channel MOSFET transistor 122 is connected to N-channel transistor 124 in a inverter configuration. The source of transistor 122 is connected to Vdd. The drain of transistor 122 is connected to the drain of transistor 124 and the control element of analog switch 112. This node forms the output of the comparator. The source of transistor 120 is connected to ground.

In operation, transistor 104 supplies a bias current to the differential pair, which is shown as transistor 108 and transistor 116. Although this differential pair is shown as just two P-channel transistors, it is well known in the art that differential pairs can be constructed with N-channel MOSFETs. Differential pairs can also be constructed using multiplies of two differential pair. When the input voltage $V^+$ on the gate of transistor 108 is much smaller than the input voltage $V^-$, the bias current flows through transistor 108 which turns on transistor 118 and turns off transistor 120. Thus, the input to inverter formed by transistors 122 and 124 are driven high by transistor 106 and the output of the comparator is driven low. Analog switch 112 connects the body of transistor 108 to $V_{B1}$ while analog switch 114 connects the body of transistor 116 to $V_{B2}$.

The comparator switches states when the $V^-$ voltage is sufficiently high relative to $V^+$. At that point, transistor 108 turns on while transistor 116 turns off, which turns transistors 110 and 118 on and 120 off. Transistor 106 then charges the gates of 122 and 124 which drives the output of the comparator low.

Since analog switches 112 and 114 are connected to the output and input of the inverter, the analog switches change body voltages of transistors 108 and 116 to $V_{B2}$ and $V_{B1}$, respectively. Qualitatively, the hysteresis is caused by changing the voltage threshold of the gates by changing the body voltage.

Figure 5:
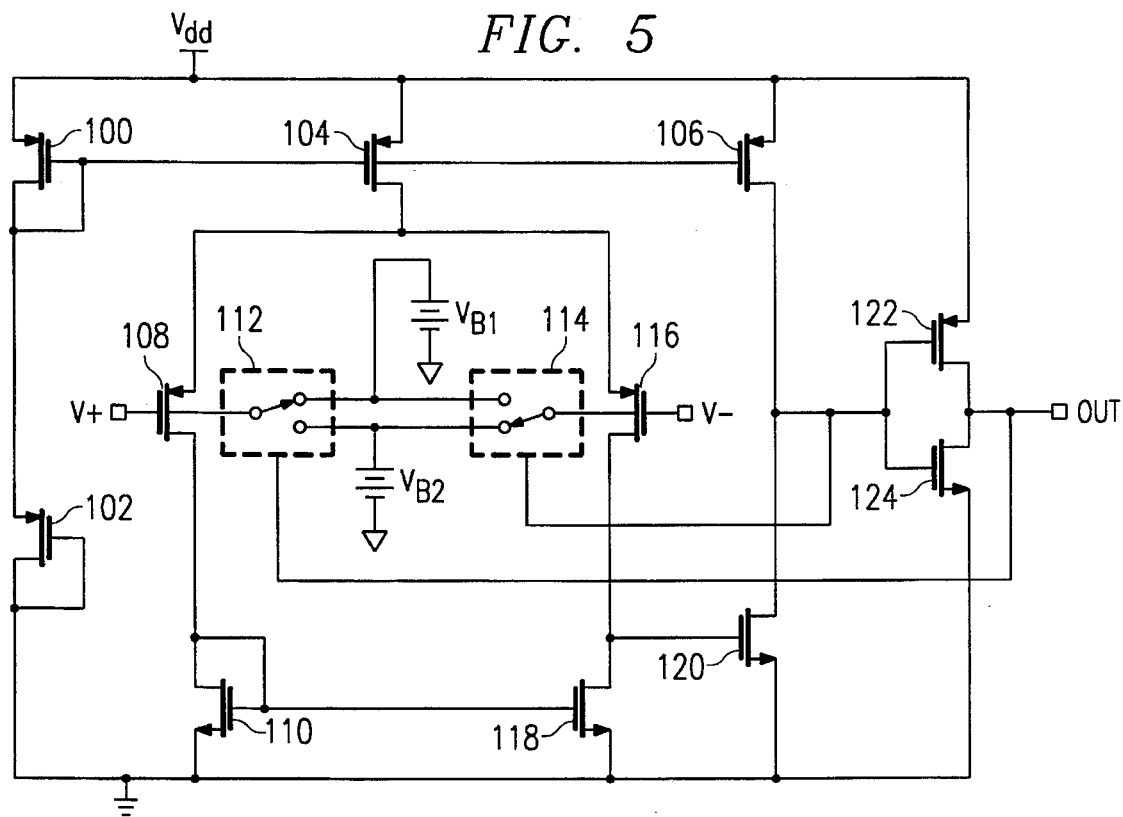
FIG. 5 is a schematic drawing of comparator with hysteresis as disclosed in an embodiment of the invention.

The embodiment in FIG. 5 is shown where the body of both transistors in the differential pair are switched. It will be appreciated that a simpler case where only one transistor, either 108 or 116 in this example, is switched while the other is connected to a fixed bias voltage. It will be appreciated by the persons skilled in the art that this design allows for easily designed hysteresis.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A comparator circuit comprising a bias current circuit, a differential input stage, and an output stage wherein the differential input stage comprises:

a transistor having a current path coupled to the bias current circuit, a gate for receiving an input voltage, and having a body; and an analog switch having a control element coupled to the output stage and having a pole coupled to the body of the transistor.

2. The comparator circuit of claim 1 wherein the analog switch comprises a double-throw analog switch.

3. The comparator of claim 2 wherein the transistor is a p-channel MOSFET.

4. A comparator circuit comprising a bias current circuit, a differential input stage, and an output stage wherein the differential input stage comprises:

a first transistor having a current path coupled to the bias current circuit, a gate for receiving a first input voltage, and having a body;

an first analog switch having a control element coupled to the output stage and having a pole coupled to the body of the first transistor;

a second transistor having a current path coupled to the bias current circuit, a gate for receiving a second input voltage, and having a body; and a second analog switch having a control element coupled to the output stage and having a pole coupled to the body of the second transistor such that, when the output of the comparator is at a high voltage, the body of the first transistor is coupled to a first reference voltage and the body of the second transistor is coupled to a second reference voltage, and, when the output of the comparator is low, the body of the first transistor is coupled to a second reference voltage and the body of the second transistor is coupled to a first reference voltage.

5. The comparator of claim 4 wherein the first analog switch is a double-throw analog switch.

6. The comparator of claim 4 wherein the first transistor comprises a p-channel MOSFET.

7. A comparator circuit comprising a bias current circuit, a differential input stage, and an output stage wherein the differential input stage comprises:

a first transistor having a current path coupled to the bias current circuit, a gate for receiving a first input voltage, and having a body; and a means for coupling the body of the first transistor to a first reference voltage when the output stage is at a high output level and to a second reference voltage when the output stage is at a low output level.

8. The comparator of claim 7 wherein the means for coupling the body of the first transistor to a first voltage reference comprises an analog switch.

9. The comparator circuit of claim 8 wherein the analog switch comprises a double-throw analog switch.

10. The comparator circuit of claim 7 wherein the first transistor comprises an n-channel MOSFET transistor.

11. A method for generating hysteresis in a comparator comprising the steps of:

coupling the body of a transistor of a differential pair to a first voltage when an output of the comparator is at a high voltage; and coupling the body of the transistor of the differential pair to a second voltage when the output of the comparator is at a low voltage.

12. The method of claim 11 wherein the step of coupling the body of a transistor to a first voltage is performed with an analog switch.

13. The method of claim 12 wherein the analog switch is a double-throw switch.

14. The method of claim 11 wherein the first voltage is fixed bias voltage.

15. A reset circuit which includes a comparator circuit comprising a bias current circuit, a differential input stage, and an output stage; wherein the differential input stage comprises:

a first transistor having a current path coupled to the bias current circuit, a gate for receiving a first input voltage, and having a body; and an first analog switch having a control element coupled to the output stage and having a pole coupled to the body of the first transistor.

16. The comparator circuit of claim 15 wherein the first analog switch comprises a double-throw analog switch.

17. The comparator of claim 16 wherein the first transistor is a p-channel MOSFET.

* * * * *